(12) United States Patent
Akimoto et al.

(10) Patent No.: US 9,076,937 B2
(45) Date of Patent: Jul. 7, 2015

(54) LIGHT EMITTING DEVICE AND METHOD FOR MANUFACTURING THE SAME

(71) Applicant: KABUSHIKI KAISHA TOSHIBA, Minato-ku, Tokyo (JP)

(72) Inventors: Yosuke Akimoto, Kanagawa-ken (JP); Akihiro Kojima, Kanagawa-ken (JP); Yoshiaki Sugizaki, Kanagawa-ken (JP); Hideto Furuyama, Kanagawa-ken (JP); Miyoko Shimada, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/781,701

(22) Filed: Feb. 28, 2013

(65) Prior Publication Data
US 2013/0240931 A1   Sep. 19, 2013

(30) Foreign Application Priority Data
Mar. 19, 2012  (JP) ................. 2012-062816

(51) Int. Cl.
| H01L 33/00 | (2010.01) |
| H01L 33/58 | (2010.01) |
| H01L 33/22 | (2010.01) |
| H01L 33/50 | (2010.01) |
| H01L 33/48 | (2010.01) |
| H01L 33/60 | (2010.01) |
| H01L 33/62 | (2010.01) |

(52) U.S. Cl.
CPC .............. *H01L 33/58* (2013.01); *H01L 33/005* (2013.01); *H01L 33/22* (2013.01); *H01L 33/50* (2013.01); *H01L 33/486* (2013.01); *H01L 33/60* (2013.01); *H01L 33/62* (2013.01); *H01L 2933/0058* (2013.01); *H01L 2924/0002* (2013.01); *H01L 33/505* (2013.01)

(58) Field of Classification Search
None
See application file for complete search history.

(56) References Cited

U.S. PATENT DOCUMENTS

| 6,472,765 B1 | 10/2002 | Sano et al. |
| 8,319,242 B2 * | 11/2012 | Shiobara et al. ............... 257/98 |
| 2005/0093008 A1 * | 5/2005 | Suehiro et al. ................. 257/98 |
| 2005/0151141 A1 | 7/2005 | Grotsch et al. |
| 2007/0102721 A1 * | 5/2007 | DenBaars et al. ............. 257/98 |
| 2010/0148198 A1 | 6/2010 | Sugizaki et al. |

(Continued)

FOREIGN PATENT DOCUMENTS

| DE | 10 2010 045403 A1 | 3/2012 |
| EP | 1 528 603 A2 | 5/2005 |

(Continued)

OTHER PUBLICATIONS

Extended European Search Report (EESR) dated Nov. 28, 2013 (in English) in counterpart European Application No. 13156535.0.

(Continued)

*Primary Examiner* — Khaja Ahmad
(74) *Attorney, Agent, or Firm* — Holtz, Holtz, Goodman & Chick PC (57) ABSTRACT

According to one embodiment, a light emitting device includes a light emitting element, a translucent section, and a light distribution control section. The light emitting element includes a first surface. The first surface emits light. The translucent section is provided on the first surface. The light distribution control section is provided on a periphery of the first surface. The light distribution control section has a lower refractive index than the translucent section.

16 Claims, 11 Drawing Sheets

(56) References Cited

U.S. PATENT DOCUMENTS

| | | | |
|---|---|---|---|
| 2010/0163896 A1* | 7/2010 | Park et al. | 257/98 |
| 2012/0097972 A1 | 4/2012 | Sugizaki et al. | |
| 2012/0235169 A1* | 9/2012 | Seko et al. | 257/88 |
| 2013/0182444 A1* | 7/2013 | Ostergaard Wagenblast Stubbe et al. | 362/309 |

FOREIGN PATENT DOCUMENTS

| | | | |
|---|---|---|---|
| JP | 2000-022216 A | 1/2000 | |
| JP | 2004-303945 A | 10/2004 | |
| JP | 2005-039104 A | 2/2005 | |
| JP | 2008518474 A | 5/2008 | |
| JP | 2008277592 A | 11/2008 | |
| JP | 2009-193995 A | 8/2009 | |
| JP | 2010-141176 A | 6/2010 | |
| JP | 2011054795 A | 3/2011 | |
| WO | 2006049805 A1 | 5/2006 | |
| WO | WO 2010/035206 A1 | 4/2010 | |

OTHER PUBLICATIONS

I. Schnitzer et al.; "30% External Quantum Efficiency From Surface Textured, Thin-Film Light-Emitting Diodes"; Applied Physics Letters; vol. 63, No. 16, pp. 2174-2176; Oct. 18, 1993; American Institute of Physics, Melville, NY, USA.

Japanese Office Action dated Jul. 4, 2014 issued in counterpart Japanese Application No. 2012-062816.

Japanese Office Action dated Nov. 6, 2014, issued in counterpart Japanese Application No. 2012-062816.

Japanese Office Action dated Feb. 6, 2015, issued in counterpart Japanese Application No. 2012-062816.

Taiwanese Office Action dated Jan. 28, 2015, issued in counterpart Taiwanese Application No. 102104570.

* cited by examiner

LIGHT EMITTING DEVICE AND METHOD FOR MANUFACTURING THE SAME

CROSS-REFERENCE TO RELATED APPLICATIONS

This application is based upon and claims the benefit of priority from Japanese Patent Application No. 2012-062816, filed on Mar. 19, 2012; the entire contents of which are incorporated herein by reference.

FIELD

Embodiments described herein relate generally to a light emitting device and a method for manufacturing the same.

BACKGROUND

For the purpose of downsizing, there is a light emitting device including a chip-like semiconductor light emitting element (hereinafter simply referred to as light emitting element).

In such a light emitting device, light emitted from the light emitting element is emitted toward a wide range on the front side of the light emitting device. Thus, the emission intensity of the light emitting device has a wide light distribution characteristic. On the other hand, such a light emitting device has been used in various applications such as the light source of an illumination device, the backlight source of an image display device, and the light source of a display device.

In this case, the light emitting device having a wide light distribution characteristic may emit wasted light in some applications.

Thus, in addition to downsizing, there is demand for the development of a light emitting device capable of changing the light distribution characteristic.

DETAILED DESCRIPTION

In general, according to one embodiment, a light emitting device includes a light emitting element, a translucent section, and a light distribution control section. The light emitting element includes a first surface. The first surface emits light. The translucent section is provided on the first surface. The light distribution control section is provided on a periphery of the first surface. The light distribution control section has a lower refractive index than the translucent section.

Embodiments will now be illustrated with reference to the drawings. In the drawings, similar components are labeled with like reference numerals, and the detailed description thereof is omitted appropriately.

[First Embodiment]

Figure 1:
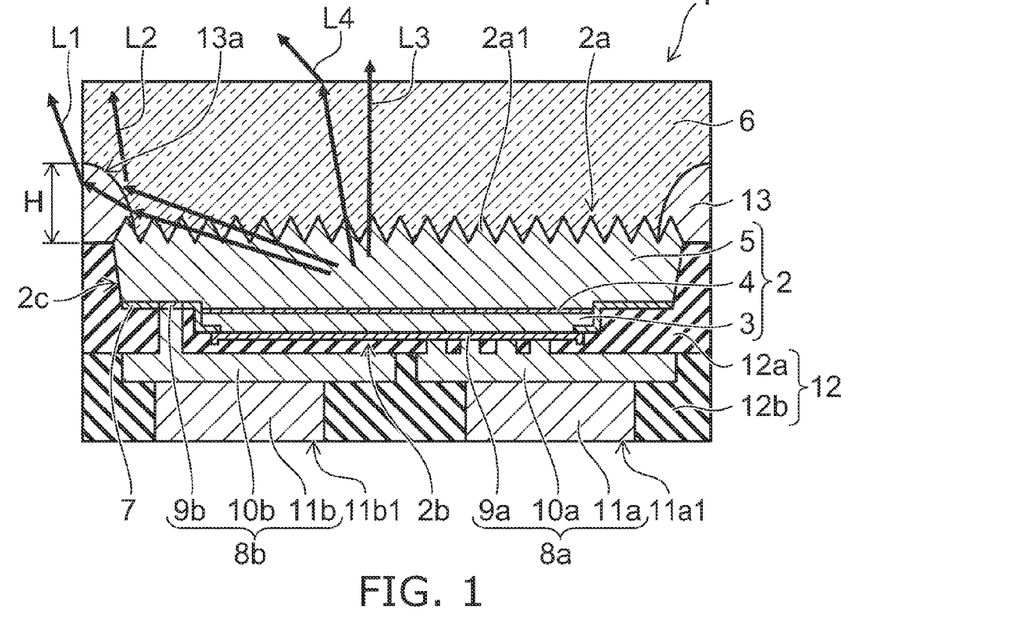
FIG. 1 is a schematic sectional view illustrating a light emitting device according to a first embodiment.

FIG. 1 is a schematic sectional view illustrating a light emitting device according to a first embodiment.

As shown in FIG. 1, the light emitting device 1 includes a light emitting element 2, a translucent section 6, an insulating section 7, a first electrode section 8a, a second electrode section 8b, a sealing section 12, and a light distribution control section 13.

The light emitting element 2 can be e.g. a light emitting diode.

In this case, the light emitting element 2 includes e.g. a first semiconductor layer 3, a light emitting layer 4 provided on the first semiconductor layer 3, and a second semiconductor layer 5 provided on the light emitting layer 4.

The first semiconductor layer 3 is a layer formed from e.g. a semiconductor doped into p-type (p-type semiconductor).

The light emitting layer 4 has e.g. a quantum well structure composed of a well layer in which holes and electrons are recombined to generate light, and a barrier layer having a larger band gap than the well layer. The second semiconductor layer 5 is a layer formed from e.g. a semiconductor doped into n-type (n-type semiconductor).

In the case where the light emitting element 2 is a blue light emitting diode that emits blue light, the semiconductor is e.g. a nitride semiconductor.

In this case, the nitride semiconductor is e.g. GaN (gallium nitride), AlN (aluminum nitride), AlGaN (aluminum gallium nitride), or InGaN (indium gallium nitride).

The light emitting surface 2a (corresponding to an example of the first surface) of the light emitting element 2 is provided with an uneven portion 2a1.

The uneven portion 2a1 suppresses the total reflection of the light emitted from the light emitting element 2. This can increase the efficiency of extracting the light generated in the light emitting element 2.

The translucent section 6 is provided on the surface 2a of the light emitting element 2.

The translucent section 6 is formed from a translucent material.

The translucent material is e.g. a translucent resin. The translucent resin is e.g. epoxy resin, silicone resin, methacrylate resin (PMMA), polycarbonate (PC), cyclic polyolefin (COP), alicyclic acrylate (OZ), allyl diglycol carbonate (ADC), acrylate resin, fluororesin, hybrid resin of silicone resin and epoxy resin, or urethane resin.

The insulating section 7 is provided so as to cover the surface 2b on the opposite side from the light emitting side of the light emitting element 2.

The insulating section 7 can be formed from e.g. $SiO_2$ (silicon oxide).

The first electrode section 8a includes e.g. a first seed section 9a, a first wiring section 10a, and a first pillar section 11a.

The second electrode section 8b includes e.g. a second seed section 9b, a second wiring section 10b, and a second pillar section 11b.

An electrode, not shown, provided on the surface of the first semiconductor layer 3 is connected to the first pillar section 11a via the first seed section 9a and the first wiring section 10a. An electrode, not shown, provided on the surface of the second semiconductor layer 5 is connected to the second pillar section 11b via the second seed section 9b and the second wiring section 10b.

That is, the first electrode section 8a is an extraction electrode connected to the electrode, not shown, provided on the first semiconductor layer 3. The second electrode section 8b is an extraction electrode connected to the electrode, not shown, provided on the second semiconductor layer 5.

The first seed section 9a, the first wiring section 10a, the first pillar section 11a, the second seed section 9b, the second wiring section 10b, and the second pillar section 11b can be formed from e.g. a metal such as copper, gold, nickel, and silver. In this case, in view of e.g. thermal conductivity, migration resistance, and adhesiveness to the sealing section 12, these sections are preferably formed from copper.

The sealing section 12 includes a first sealing section 12a and a second sealing section 12b.

The first sealing section 12a is provided so as to cover the surface 2b side and the side surface 2c (corresponding to an example of the second surface) side of the light emitting element 2.

The second sealing section 12b is provided so as to cover the first wiring section 10a, the first pillar section 11a, the second wiring section 10b, and the second pillar section 11b. However, the end surface 11a1 of the first pillar section 11a and the end surface 11b1 of the second pillar section 11b are exposed from the second sealing section 12b.

The first sealing section 12a and the second sealing section 12b can be formed from an organic material or inorganic material having insulating property. In this case, the first sealing section 12a, the second sealing section 12b, and the insulating section 7 can be integrally formed.

The thickness of the first pillar section 11a, the second pillar section 11b, and the second sealing section 12b can be thickened. Then, even if the thickness of the light emitting element 2 is thin, the decrease of mechanical strength of the light emitting element 2 can be compensated.

The light distribution control section 13 is provided on the periphery of the surface 2a of the light emitting element 2. The light distribution control section 13 can be provided so as to surround the surface 2a of the light emitting element 2. Alternatively, the light distribution control section 13 can be provided on part of the periphery of the surface 2a.

As illustrated in FIG. 1, the light distribution control section 13 can be provided so as to partly extend to the inside of the outline of the surface 2a. Alternatively, the light distribution control section 13 can be provided outside the outline of the surface 2a, or can be provided so that the outline of the light distribution control section 13 overlaps the outline of the surface 2a.

The refractive index of the light distribution control section 13 is lower than the refractive index of the translucent section 6.

Thus, the light L1 incident on the light distribution control section 13 is refracted toward the front side of the light emitting device 1.

The material of the light distribution control section 13 is not particularly limited, but can be appropriately selected from inorganic materials and organic materials such that the refractive index of the light distribution control section 13 is lower than the refractive index of the translucent section 6.

Furthermore, the light distribution control section 13 can be translucent. For instance, the light distribution control section 13 can be formed from a translucent material such as transparent and semi-transparent material. In this case, the light distribution control section 13 can be formed from a material having high reflectance such as white resin.

The light distribution control section 13 includes an inclined surface 13a inclined in a direction such that the tip of the light distribution control section 13 is located away from the center side of the surface 2a.

The translucent section 6 is provided so as to cover the inclined surface 13a.

The light distribution control section 13 including the inclined surface 13a can increase the incident angle of the light L2 incident on the light distribution control section 13. This facilitates total reflection of the light L2, and hence facilitates emitting the light L2 toward the front side of the light emitting device 1.

In this example, the inclined surface 13a is a curved surface. However, the inclined surface 13a may be a flat surface.

For a large difference between the refractive index of the light distribution control section 13 and the refractive index of the translucent section 6, total reflection is more likely to occur even in the case where the incident angle of the light incident on the light distribution control section 13 is small.

The height dimension H of the light distribution control section 13 is not particularly limited. However, a larger height dimension H of the light distribution control section 13 facilitates emitting the light toward the front side of the light emitting device 1. The details on the height dimension H of the light distribution control section 13 will be described later (see, e.g., FIGS. 4A and 4B).

The light L3 and the light L4 emitted from the light emitting element 2 toward the front side of the light emitting device 1 are emitted toward the front side of the light emitting device 1 without being incident on the light distribution control section 13.

As illustrated above, according to this embodiment, a light distribution control section 13 having a lower refractive index than the translucent section 6 is provided. This can increase the light emitted to the front side of the light emitting device 1. That is, because the light distribution control section 13 having a lower refractive index than the translucent section 6 is provided, the light distribution characteristic can be narrowed.

Furthermore, a desired light distribution characteristic can be obtained by changing the refractive index of the light distribution control section 13, the angle of the inclined surface 13a, and the height dimension H of the light distribution control section 13.

[Second Embodiment]

Figure 2:
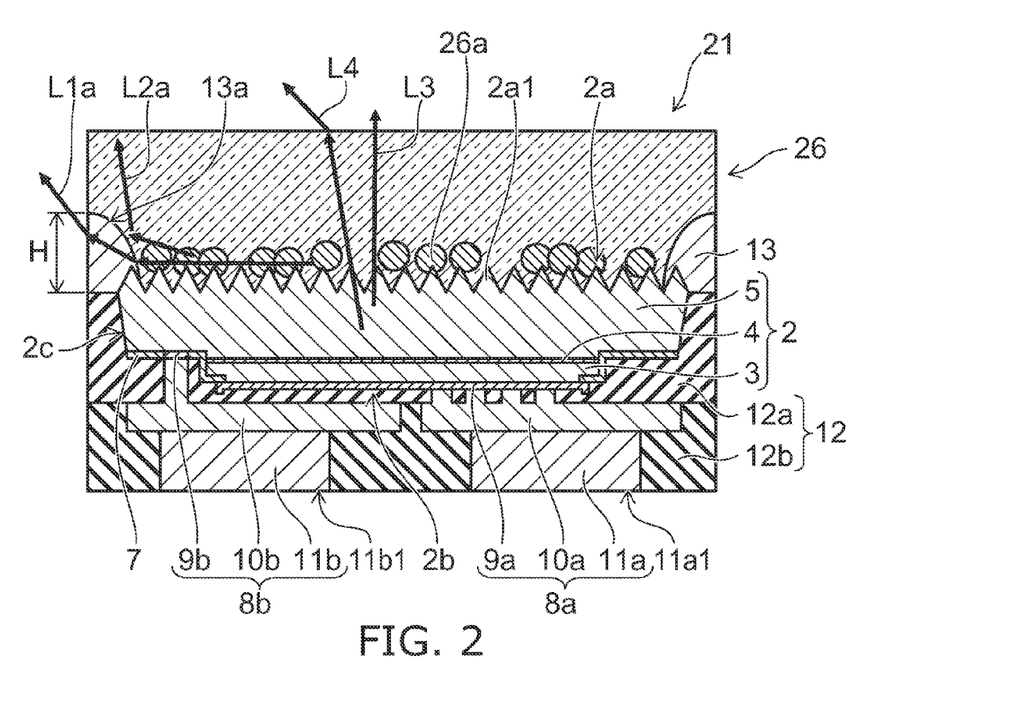
FIG. 2 is a schematic sectional view illustrating a light emitting device according to a second embodiment.

FIG. 2 is a schematic sectional view illustrating a light emitting device according to a second embodiment.

As shown in FIG. 2, the light emitting device 21 includes a light emitting element 2, a translucent section 26, an insulating section 7, a first electrode section 8a, a second electrode section 8b, a sealing section 12, and a light distribution control section 13.

The translucent section 26 is provided on the surface 2a of the light emitting element 2.

The translucent section 26 includes a translucent material and a phosphor 26a. The translucent material can be made similar to that of the translucent section 6 described above.

In this case, the refractive index of the light distribution control section 13 is lower than the refractive index of the translucent section 26.

The phosphor 26a is unevenly distributed inside the translucent section 26 on the surface 2a side of the light emitting element 2. That is, the phosphor 26a is provided inside the translucent section 26 near the surface 2a of the light emitting element 2.

In this case, the phosphor 26a can be in contact with the surface 2a of the light emitting element 2.

The phosphor 26a is located only inside the periphery of the surface 2a of the light emitting element 2.

This can decrease the light emitted toward e.g. the substrate on the rear side of the light emitting device 21 when the light emitting device 21 is mounted on e.g. the substrate.

The phosphor 26a is particulate. The phosphor 26a absorbs part of the light emitted from the light emitting element 2 and emits fluorescence having a prescribed wavelength.

For instance, the phosphor 26a can absorb part of blue light emitted from the light emitting element 2 and emit yellow fluorescence. In this case, for instance, blue light L3, L4 not absorbed by the phosphor 26a and yellow fluorescence L1a, L2a emitted from the phosphor 26a are emitted from the translucent section 26.

It is possible to use one kind of phosphor. Alternatively, it is also possible to use a plurality of kinds of phosphor in combination.

For instance, for blue light emitted from the light emitting element 2, it is possible to use only a phosphor emitting yellow fluorescence. Alternatively, for blue light emitted from the light emitting element 2, it is also possible to use a phosphor emitting red fluorescence and a phosphor emitting green fluorescence in combination. In this case, blue light, red light, and green light are emitted from the translucent section 26.

Examples of the material of the phosphor emitting yellow fluorescence can include the following. However, the phosphor emitting yellow fluorescence is not limited thereto, but can be appropriately modified.

$Li(Eu,Sm)W_2O_8$,
$(Y,Gd)_3(Al,Ga)_5O_{12}:Ce^{3+}$,
$Li_2SrSiO_4:Eu^{2+}$,
$(Sr(Ca,Ba))_3SiO_5:Eu^{2+}$,
$SrSi_2ON_{2.7}:Eu^{2+}$

Examples of the material of the phosphor emitting red fluorescence can include the following. However, the phosphor emitting red fluorescence is not limited thereto, but can be appropriately modified.

$La_2O_2S:Eu,Sm$,
$LaSi_3N_5:Eu^{2+}$,
$\alpha$-sialon:$Eu^{2+}$,
$CaAlSiN_3:Eu^{2+}$,
$(SrCa)AlSiN_3:Eu^{x+}$,
$Sr_x(Si_yAl_3)_z(O_xN):Eu^{x+}$ Examples of the material of the phosphor emitting green fluorescence can include the following. However, the phosphor emitting green fluorescence is not limited thereto, but can be appropriately modified.

$(Ba,Sr,Mg)O.aAl_2O_3:Mn$,
$(BrSr)SiO_4:Eu$,
$\alpha$-sialon:$Yb^{2+}$,
$\beta$-sialon:$Eu^{2+}$,
$(CaSr)Si_2O_4N_7:Eu^{2+}$,
$Sr(SiAl)(ON):Ce$ The kind and combination of the colors of fluorescence emitted by the phosphor are not limited to those illustrated, but can be appropriately modified depending on the purpose and the like of the light emitting device 21.

Figure 3:
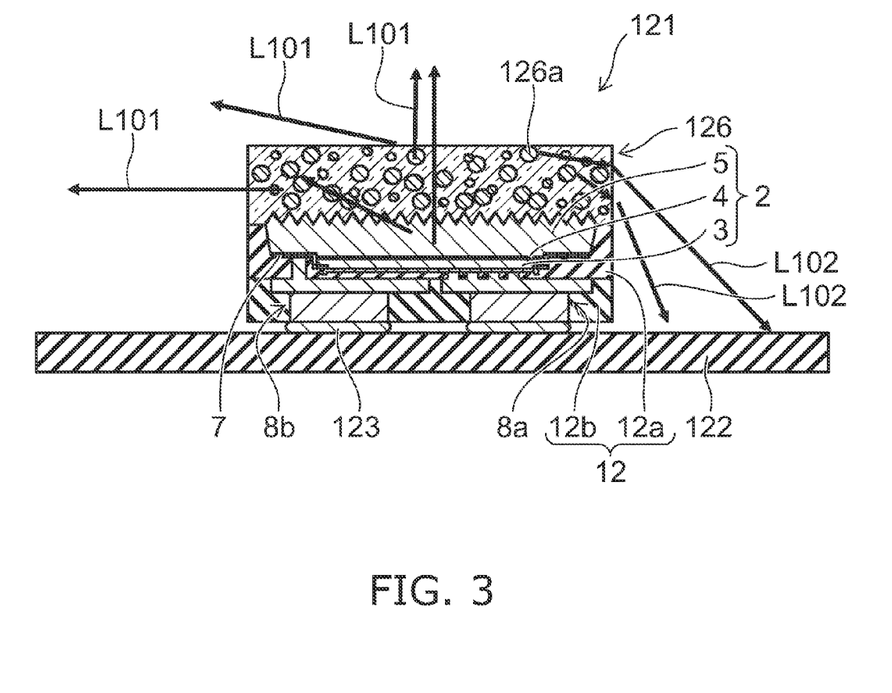
FIG. 3 is a schematic sectional view illustrating a light emitting device according to a comparative example.

FIG. 3 is a schematic sectional view illustrating a light emitting device according to a comparative example.

FIG. 3 shows the light emitting device 121 according to the comparative example mounted on a substrate 122. The bonding section 123 in FIG. 3 is formed from e.g. solder.

As shown in FIG. 3, a phosphor 126a is dispersed inside the translucent section 126.

Here, the transmission length of the light transmitted inside the translucent section 126 is varied with the direction of the light emitted from the light emitting element 2. Thus, in the case where the phosphor 126a is dispersed inside the translucent section 126, the amount of phosphor contained in the transmission length is varied with the direction of the light emitted from the light emitting element 2. For instance, with the increase of the transmission length of the light transmitted inside the translucent section 126, the amount of phosphor 126a contained in the transmission length is increased. This increases the amount of fluorescence emitted from the phosphor 126a. As a result, the tin is varied with the direction of the light emitted from the light emitting element 2.

In contrast, in the light emitting device 21 described above, the phosphor 26a is unevenly distributed inside the translucent section 26 on the surface 2a side of the light emitting element 2. Thus, even if the transmission length of the light transmitted inside the translucent section 26 is varied, the variation of the amount of the phosphor 26a contained in the transmission length can be suppressed. As a result, the variation of the tint with the direction of the light emitted from the light emitting element 2 can be suppressed.

In the light emitting device 121 according to the comparative example, the phosphor 126a is dispersed inside the translucent section 126. Thus, the fluorescence L101 emitted from the phosphor 126a is emitted in a wide range on the front side and side surface side of the light emitting device 121. Furthermore, the fluorescence L102 emitted from the phosphor 126a is emitted toward the substrate 122 on the rear side of the light emitting device 121.

In this case, the fluorescence L102 emitted toward the substrate 122 is reflected by the substrate 122, but incurs a greater loss.

Furthermore, the light emitting device 121 has a wide light distribution characteristic. However, this may be unsuitable depending on the purpose of the light emitting device 121.

In contrast, in the light emitting device 21 described above, the refractive index of the light distribution control section 13 is lower than the refractive index of the translucent section 26. This can increase the light emitted to the front side of the light emitting device 21. That is, because the light distribution control section 13 having a lower refractive index than the translucent section 26 is provided, the light distribution characteristic can be narrowed.

Furthermore, a desired light distribution characteristic can be obtained by changing the refractive index of the light distribution control section 13, the angle of the inclined surface 13*a*, and the height dimension H of the light distribution control section 13.

Figure 4A:
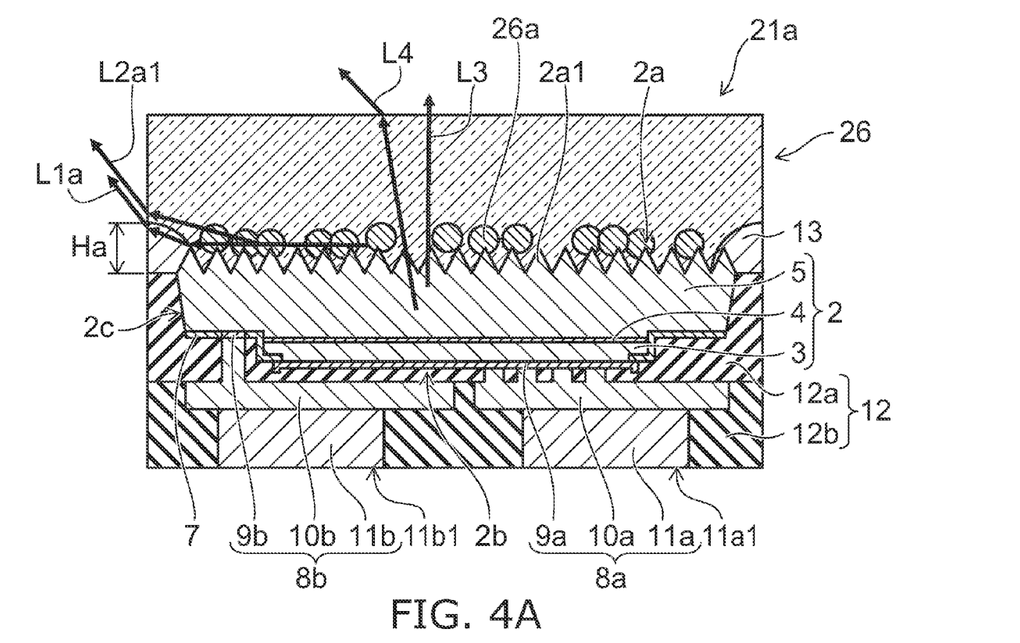
FIGS. 4A and 4B are schematic sectional views illustrating the height dimension of the light distribution control section 13.
Figure 4B:
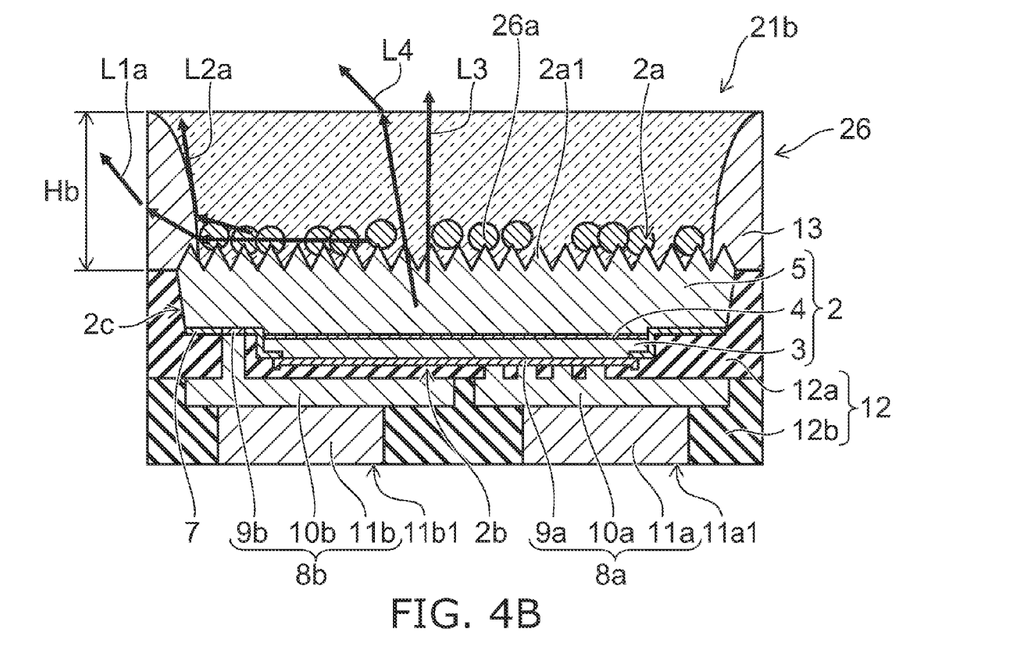

The height dimension of the light distribution control section 13 is now further illustrated.

FIGS. 4A and 4B are schematic sectional views illustrating the height dimension of the light distribution control section 13.

As shown in FIG. 4A, for a small height dimension Ha of the light distribution control section 13, the fluorescence L2*a*1 emitted from the phosphor 26*a* is made more likely to be emitted from the side surface side of the light emitting device 21*a* without being incident on the light distribution control section 13. Thus, the light distribution characteristic can be widened.

In this case, the height dimension Ha of the light distribution control section 13 can be made larger than e.g. the average diameter dimension of the phosphor 26*a*.

As shown in FIG. 4B, for a large height dimension Hb of the light distribution control section 13, the fluorescence L2*a* emitted from the phosphor 26*a* is made more likely to be incident on the light distribution control section 13. This facilitates emitting the light from the front side of the light emitting device 21. Thus, the light distribution characteristic can be narrowed.

In this case, the height dimension Hb of the light distribution control section 13 can be made less than or equal to the thickness dimension of the translucent section 26.

[Third Embodiment]

Figure 5A:
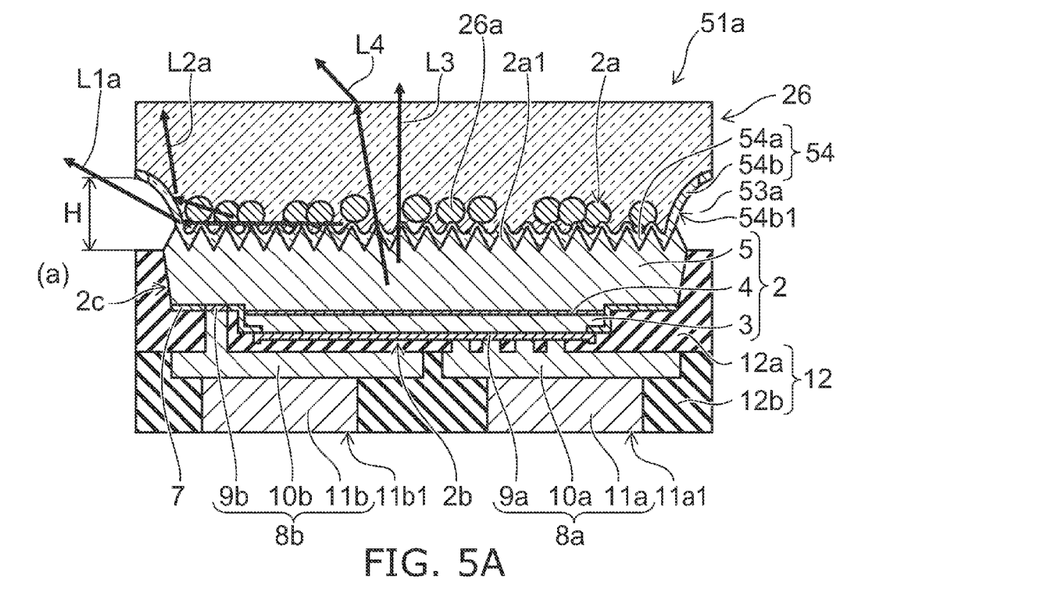
FIGS. 5A and 5B are schematic sectional views illustrating light emitting devices according to a third embodiment.
Figure 5B:
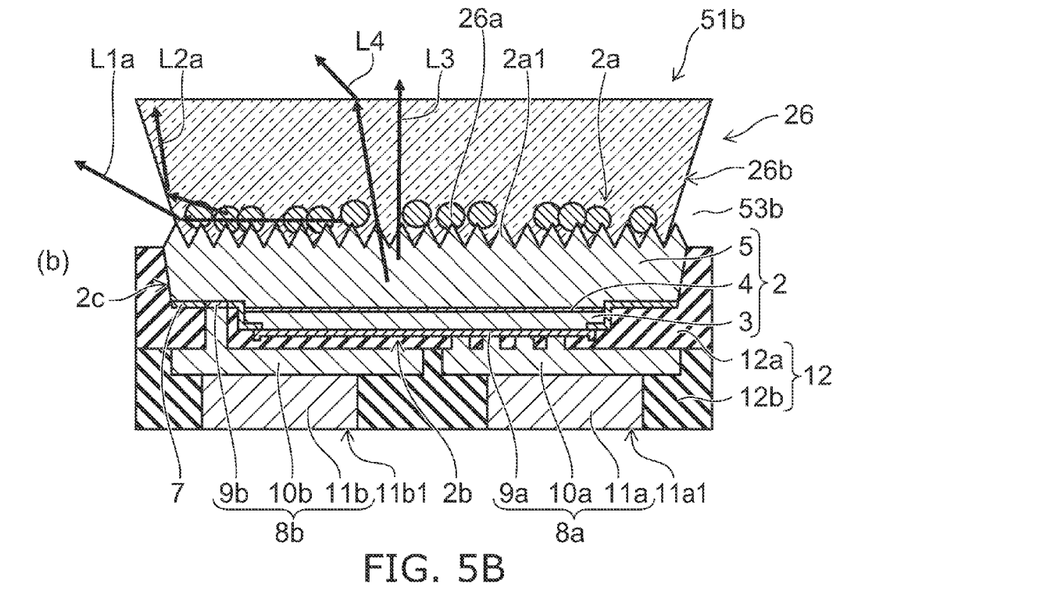

FIGS. 5A and 5B are schematic sectional views illustrating light emitting devices according to a third embodiment.

As shown in FIG. 5A, the light emitting device 51*a* includes a light emitting element 2, a translucent section 26, an insulating section 7, a first electrode section 8*a*, a second electrode section 8*b*, a sealing section 12, a light distribution control section 53*a*, and a translucent film 54.

The translucent film 54 includes a film section 54*a* and a protrusion 54*b*.

The film section 54*a* is provided so as to cover the surface 2*a* of the light emitting element 2.

The protrusion 54*b* is provided on the periphery of the surface 2*a* of the light emitting element 2. The protrusion 54*b* protrudes in a direction away from the surface 2*a*. A space is provided on the inner surface 54*b*1 side of the protrusion 54*b*. That is, a space is provided on the periphery of the surface 2*a* of the light emitting element 2.

The space provided on the periphery of the surface 2*a* is filled with the gas in the atmosphere in which the light emitting device 51*a* is provided. The gas in the atmosphere in which the light emitting device 51*a* is provided is e.g. air.

In general, the refractive index of the gas in the atmosphere in which the light emitting device 51*a* is provided (e.g., the refractive index of air) is lower than the refractive index of the material forming the translucent section 26.

Thus, the space provided on the periphery of the surface 2*a* can be used as the light distribution control section 53*a*.

In this case, the translucent film 54 is provided between the inclined surface of the light distribution control section 53*a* and the translucent section 26.

The light distribution control section 13 illustrated in FIGS. 1 and 2 includes an inorganic material or organic material. However, the light distribution control section 53*a* includes the gas in the atmosphere in which the light emitting device 51*a* is provided.

The translucent film 54 can be formed from a translucent material.

The translucent film 54 can be formed from e.g. SiO$_2$ or SiN (silicon nitride).

In this case, the refractive index of the translucent film 54 is not particularly limited. However, the refractive index of the translucent film 54 is preferably made lower than the refractive index of the translucent section 26.

The translucent film 54 is not necessarily needed, but can be omitted. However, providing the translucent film 54 facilitates forming the light distribution control section 53*a*.

As shown in FIG. 5B, the light emitting device 51*b* includes a light emitting element 2, a translucent section 26, an insulating section 7, a first electrode section 8*a*, a second electrode section 8*b*, a sealing section 12, and a light distribution control section 53*b*.

A recess 26*b* is provided on the side surface of the translucent section 26. The recess 26*b* is provided on the periphery of the surface 2*a* of the light emitting element 2. That is, by providing the recess 26*b*, a space is provided on the periphery of the surface 2*a* of the light emitting element 2.

The space provided on the periphery of the surface 2*a* is filled with the gas in the atmosphere in which the light emitting device 51*b* is provided. The gas in the atmosphere in which the light emitting device 51*b* is provided is e.g. air.

Thus, the space provided on the periphery of the surface 2*a* can be used as the light distribution control section 53*b*.

In this case, the light distribution control section 53*b* includes the gas in the atmosphere in which the light emitting device 51*b* is provided.

The light distribution control section 53*a* illustrated in FIG. 5A is composed of the space provided on the inner surface 54*b*1 side of the protrusion 54*b*. On the other hand, the light distribution control section 53*b* is composed of the space provided on the side surface side of the translucent section 26. That is, the light distribution control section 53*b* corresponds to the case where the translucent film 54 described above is not provided.

The light emitting devices 51*a* and 51*b* according to this embodiment can also achieve a function and effect similar to those of the light emitting device 21 described above.

[Fourth Embodiment]

Figure 6:
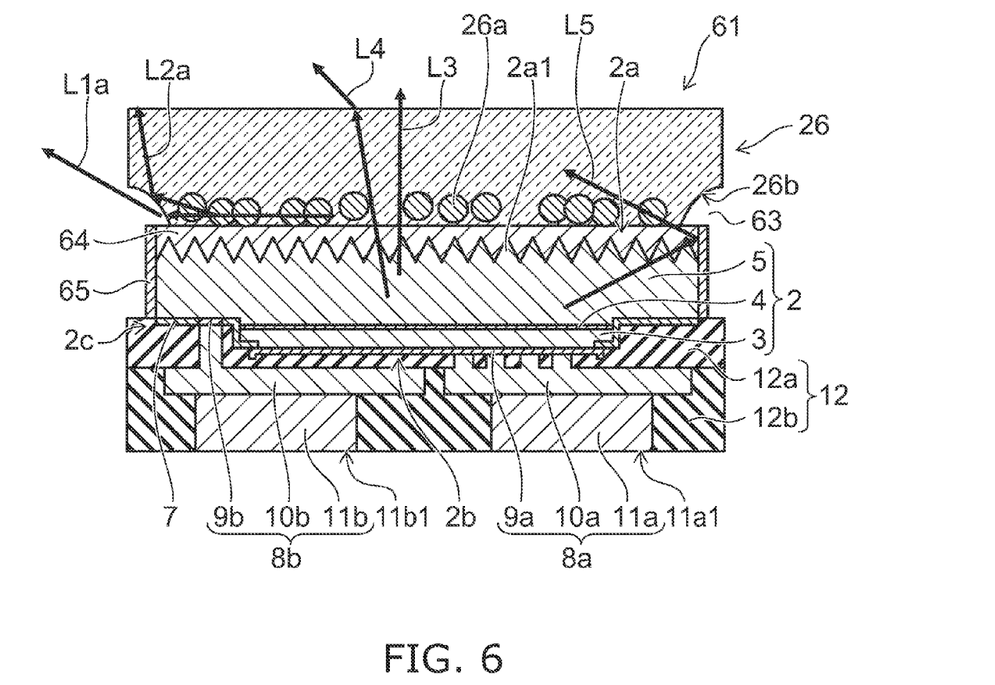
FIG. 6 is a schematic sectional view illustrating a light emitting device according to a fourth embodiment.

FIG. 6 is a schematic sectional view illustrating a light emitting device according to a fourth embodiment.

As shown in FIG. 6, the light emitting device 61 includes a light emitting element 2, a translucent section 26, an insulating section 7, a first electrode section 8*a*, a second electrode section 8*b*, a sealing section 12, a light distribution control section 63, a protective film 64, and a reflecting section 65.

The light distribution control section 63 can be made similar to the light distribution control section 53*b* described above. That is, the space formed by providing a recess 26*b* on the side surface of the translucent section 26 constitutes the light distribution control section 63.

The protective film 64 is provided so as to cover the surface 2*a* of the light emitting element 2.

The protective film 64 can be formed from a translucent material. The protective film 64 can be formed from e.g. SiO$_2$.

The reflecting section 65 is provided on the side surface 2*c* side of the light emitting element 2. The reflecting section 65 can be formed from a material having high reflectance. The material having high reflectance is e.g. metal. In this case, in view of corrosivity and the like, the reflecting section 65 is preferably formed from e.g. aluminum.

In the case where the light distribution control section 63 is composed of the space provided on the side surface side of the translucent section 26, the light incident on the light distribution control section 63 is made more likely to be emitted to the side surface side of the light emitting device 61. In this embodiment, the reflecting section 65 is provided on the side surface 2c side of the light emitting element 2. Thus, the light L5 directed to the side surface side of the light emitting device 61 can be reflected.

This can further increase the light emitted to the front side of the light emitting device 61.

Furthermore, the light distribution characteristic can be changed by changing the height dimension of the reflecting section 65.

Furthermore, the light emitting device 61 according to this embodiment can also achieve a function and effect similar to those of the light emitting device 21 described above.

The light emitting devices illustrated above correspond to the case of the light emitting device based on WLP (wafer-level package).

However, the embodiments are not limited to the light emitting device based on WLP, but are widely applicable to a light emitting device in which a translucent section is provided on the light emitting surface 2a of the light emitting element 2. For instance, the embodiments are also applicable to a light emitting device in which the light emitting element 2 is flip-chip connected to a substrate including a wiring layer.

Next, a method for manufacturing a light emitting device is illustrated.

[Fifth Embodiment]

Figure 7A:
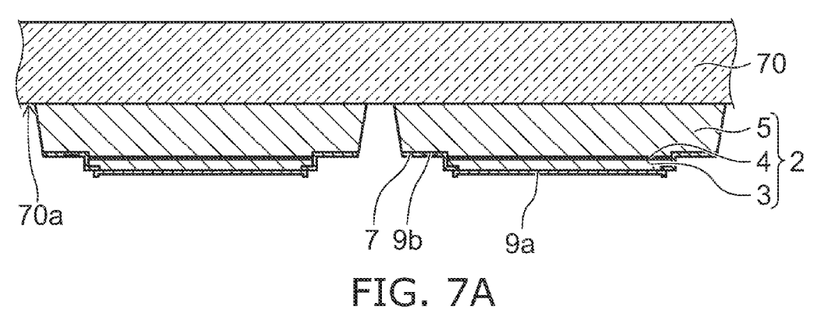
FIGS. 7A to 7C are schematic process sectional views illustrating the steps from forming a light emitting element 2 to forming a sealing section 12 in the method for manufacturing a light emitting device.
Figure 7B:
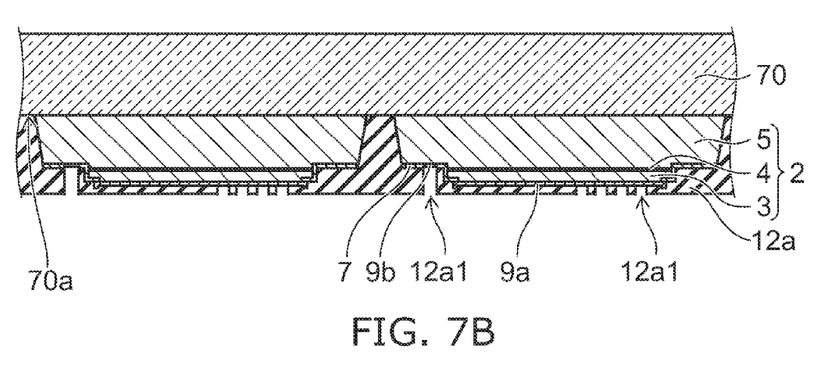
Figure 7C:
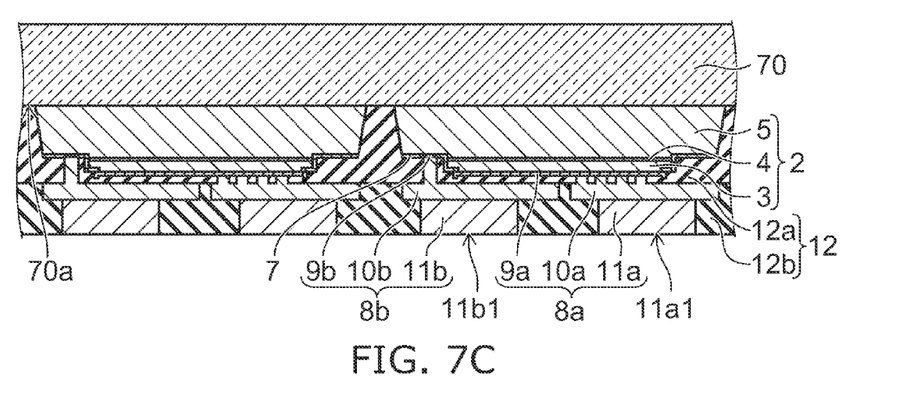

FIGS. 7A to 7C are schematic process sectional views illustrating the steps from forming a light emitting element 2 to forming a sealing section 12 in the method for manufacturing a light emitting device.

First, as shown in FIG. 7A, on the surface 70a of a substrate 70 made of e.g. sapphire, a second semiconductor layer 5, a light emitting layer 4, and a first semiconductor layer 3 are formed. That is, a light emitting element 2 including a light emitting surface 2a is formed. Then, an insulating section 7 is formed on the surface of the second semiconductor layer 5 and the first semiconductor layer 3. A first seed section 9a is formed on the surface of the first semiconductor layer 3. A second seed section 9b is formed on the surface of the second semiconductor layer 5.

These components can be formed by known techniques such as film formation, photolithography, and dry etching.

Next, as shown in FIG. 7B, a first sealing section 12a is formed on the entire surface on the surface 70a side. An opening 12a1 is formed so as to expose part of the first seed section 9a and the second seed section 9b.

Next, as shown in FIG. 7C, by using a known film formation technique, a film constituting a first wiring section 10a, a second wiring section 10b, a first pillar section 11a, and a second pillar section 11b is formed. By using the photolithography technique and dry etching technique, a first wiring section 10a, a second wiring section 10b, a first pillar section 11a, and a second pillar section 11b are successively formed. Then, by using a technique such as spin coating, a film constituting a second sealing section 12b is formed on the entire surface on the surface 70a side. The film is planarized so as to expose the end surface 11a1 of the first pillar section 11a and the end surface 11b1 of the second pillar section 11b. Thus, a second sealing section 12b is formed.

Furthermore, by using a technique such as lift-off, the substrate 70 is removed.

Figure 8A:
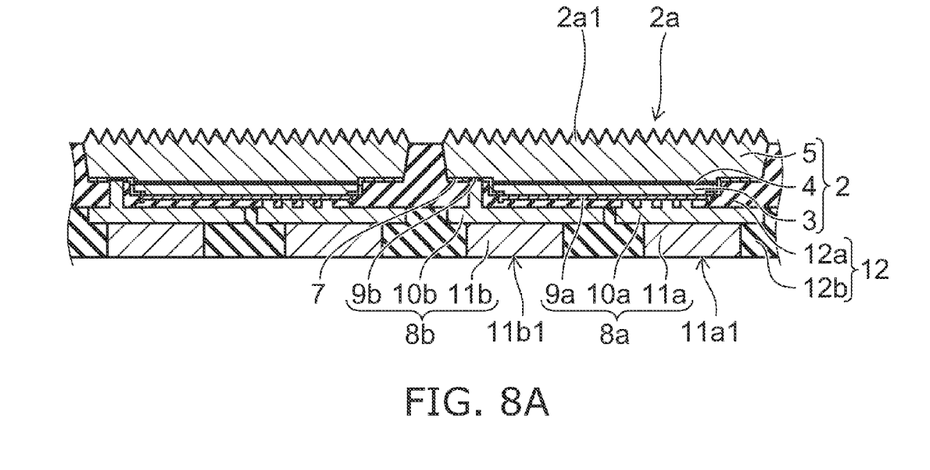
FIGS. 8A and 8B are schematic process sectional views illustrating the steps from forming an uneven portion 2a1 to forming a light distribution control section 13 in the method for manufacturing a light emitting device.
Figure 8B:
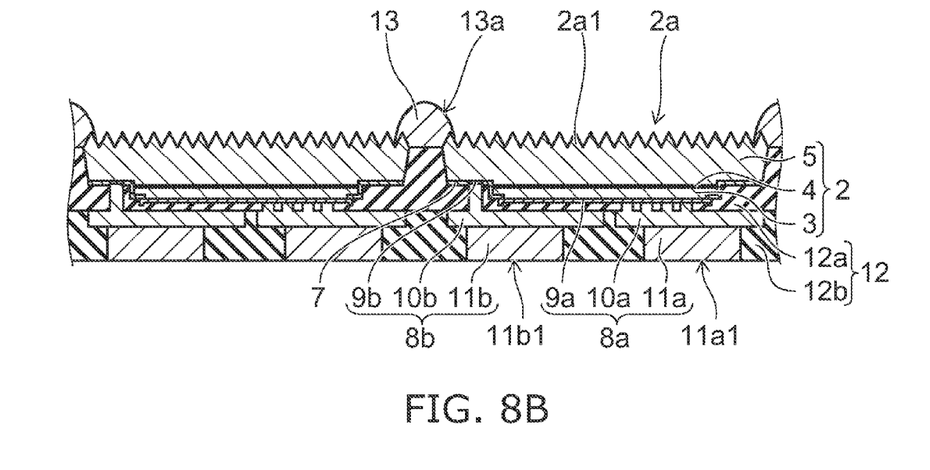

FIGS. 8A and 8B are schematic process sectional views illustrating the steps from forming an uneven portion 2a1 to forming a light distribution control section 13 in the method for manufacturing a light emitting device.

First, as shown in FIG. 8A, an uneven portion 2a1 is formed on the surface 2a of the light emitting element 2.

In the case where the second semiconductor layer 5 is formed from e.g. GaN, the uneven portion 2a1 can be formed by using the we etching technique. For instance, the surface 2a can be we etched with an aqueous solution of tetramethylammonium hydroxide (($CH_3$)$_4$NOH) (TMH) or an aqueous solution of potassium hydroxide (KOH) to form an uneven portion 2a1 based on the crystal structure.

Alternatively, an uneven portion 2a1 can be formed on the surface 2a by using the photolithography technique and dry etching technique.

Next, as shown in FIG. 8B, a light distribution control section 13 is formed on the periphery of the surface 2a. In this case, a light distribution control section 13 having a lower refractive index than the translucent section 6, 26 is formed.

The light distribution control section 13 can be formed by using a technique such as vacuum screen printing and molding.

For instance, by using a technique such as vacuum screen printing, molding, and dispensing a resin having a prescribed refractive index is applied to the periphery of the surface 2a of the light emitting element 2, and cured to form a light distribution control section 13. In this case, by surface tension, the side surface of the applied resin can be shaped into an inclined surface. Thus, by curing this, a light distribution control section 13 including an inclined surface 13a can be formed.

Figure 9A:
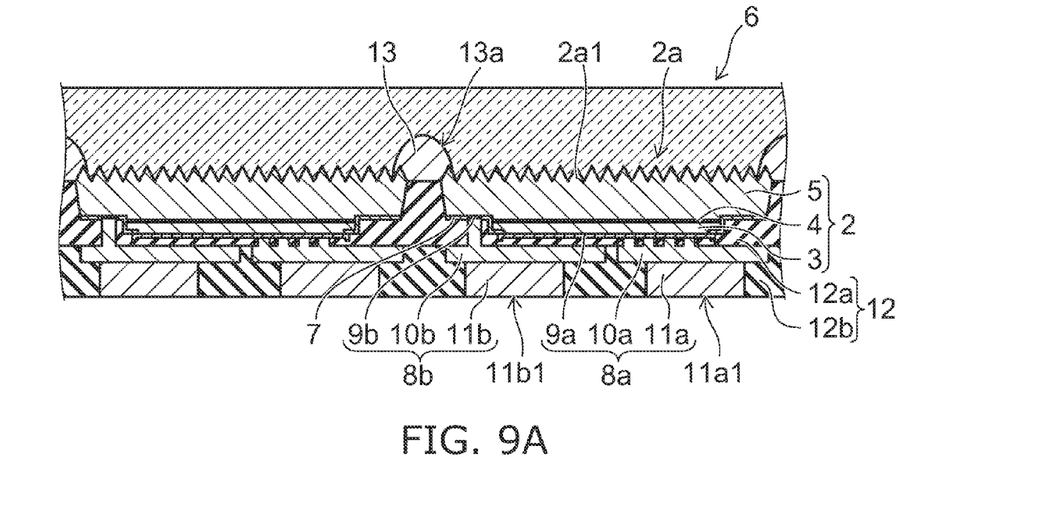
FIGS. 9A and 9B are schematic process sectional views illustrating the step of forming a translucent section 6, 26 in the method for manufacturing a light emitting device.
Figure 9B:
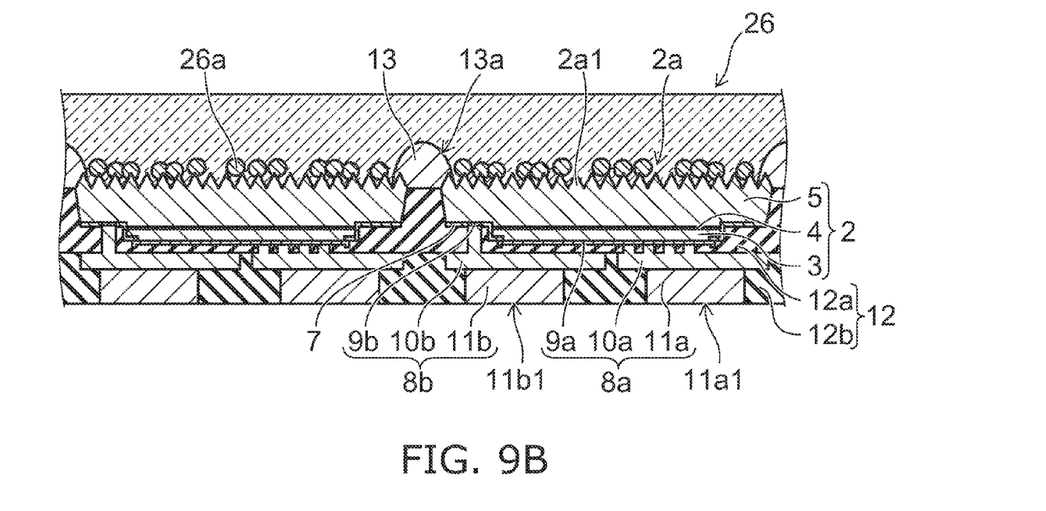

FIGS. 9A and 9B are schematic process sectional views illustrating the step of forming a translucent section 6, 26 in the method for manufacturing a light emitting device.

As shown in FIG. 9A, a translucent section 6 is formed so as to cover the entire surface on the surface 2a side of the light emitting element 2.

The translucent section 6 can be formed by using a technique such as vacuum screen printing and molding.

For instance, by using a technique such as vacuum screen printing and molding, a translucent resin is applied to the surface 2a side of the light emitting element 2, and cured to form a translucent section 6.

Alternatively, as shown in FIG. 9B, a translucent section 26 including a phosphor 26a is formed so as to cover the entire surface on the surface 2a side of the light emitting element 2.

The translucent section 26 can be formed by using a technique such as vacuum screen printing and molding.

For instance, by using a technique such as vacuum screen printing and molding, a translucent resin including a phosphor 26a is applied to the surface 2a side of the light emitting element 2, and cured to form a translucent section 26.

After applying a resin including a phosphor 26a, the phosphor 26a can be sedimented in the resin so that the phosphor 26a is unevenly distributed on the surface 2a side of the light emitting element 2.

Alternatively, after applying a resin not including a phosphor 26a, a phosphor 26a can be added and sedimented in the resin.

The sedimentation can be caused by gravity.

By adjusting the viscosity of the resin, sedimentation of the phosphor 26a can be facilitated. The viscosity of the resin can be adjusted by e.g. changing the amount of filler added to the resin or changing the amount of solvent added to the resin.

Figure 10A:
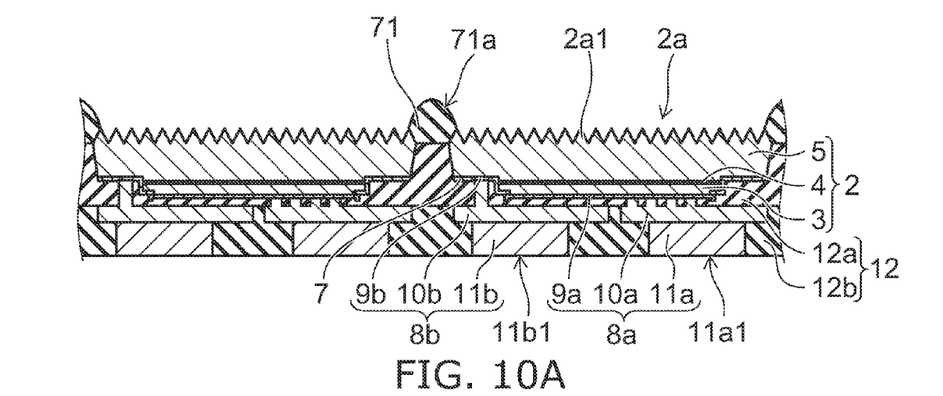
FIGS. 10A, 10B, and 11 are schematic process sectional views illustrating the step of forming a light distribution control section 53a in the method for manufacturing a light emitting device.
Figure 10B:
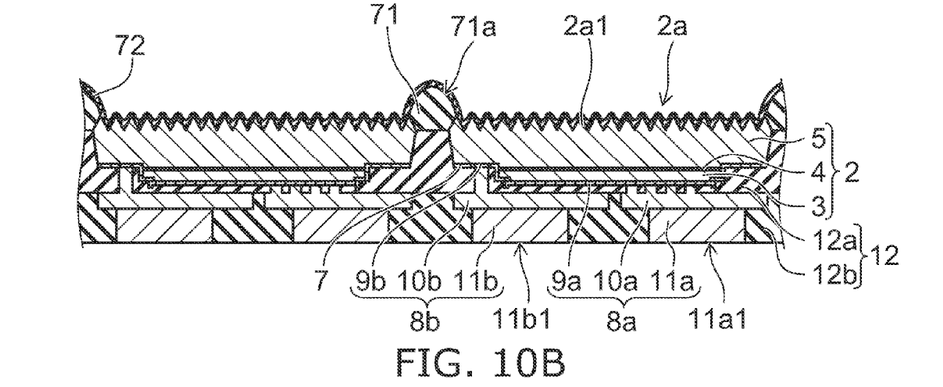
Figure 11:
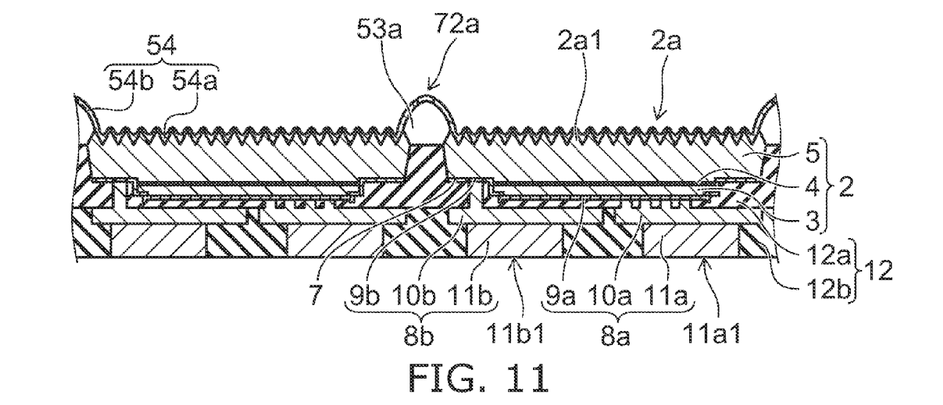

FIGS. 10A, 10B, and 11 are schematic process sectional views illustrating the step of forming a light distribution control section 53a in the method for manufacturing a light emitting device.

First, as shown in FIG. 10A, by using a technique such as vacuum screen printing and molding, a sacrificial layer 71 is formed on the periphery of the surface 2a of the light emitting element 2. In this case, by surface tension, an inclined surface 71a can be formed on the sacrificial layer 71. The sacrificial layer 71 can be formed by applying a resist using a technique such as vacuum screen printing and molding.

Next, as shown in FIG. 10B, a film 72 constituting a translucent film 54 is formed so as to cover the entire surface on the surface 2a side of the light emitting element 2.

That is, a film 72 constituting a translucent film 54 is formed so as to cover the sacrificial layer 71.

The film 72 constituting a translucent film 54 can be formed by forming a film made of $SiO_2$ or SiN using a technique such as sputtering.

Next, as shown in FIG. 11, a hole 72a reaching e.g. the top of the sacrificial layer 71 is formed in the film 72. The sacrificial layer 71 is removed via the hole 72a. Thus, a translucent film 54 including a film section 54a and a protrusion 54b is formed. The space formed by removing the sacrificial layer 71 constitutes a light distribution control section 53a.

In the case where the sacrificial layer 71 is formed from a resist, the sacrificial layer 71 can be removed by a technique such as we etching with e.g. acetone, and dry etching with e.g. oxygen plasma.

In the case of forming the light distribution control section 53b illustrated in FIG. 5B, the light distribution control section 53b can be formed as follows. By using a technique such as vacuum screen printing and molding, a sacrificial layer 71 is formed on the periphery of the surface 2a of the light emitting element 2. A translucent section 6, 26 is formed so as to cover the sacrificial layer 71. A hole reaching e.g. the top of the sacrificial layer 71 is formed in the translucent section 6, 26. The sacrificial layer 71 is removed via the hole.

Then, after forming the light distribution control section 53a, 53b, the translucent section 6, 26 described above can be formed.

Next, formation of the protective film 64 and the reflecting section 65 illustrated in FIG. 6 is illustrated.

FIGS. 12A to 12D are schematic process sectional views illustrating the steps of forming a protective film 64 and a reflecting section 65.

Figure 12A:
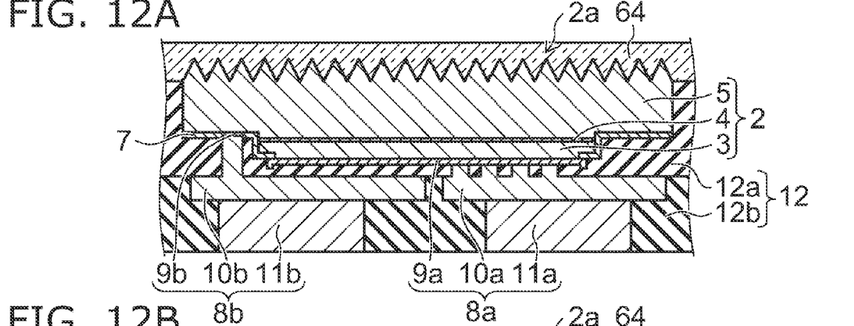
FIGS. 12A to 12D are schematic process sectional views illustrating the steps of forming a protective film 64 and a reflecting section 65.

First, as shown in FIG. 12A, a protective film 64 is formed so as to cover the entire surface on the surface 2a side of the light emitting element 2. For instance, by using the spin coating technique, a SOG (spin on glass) film is formed. Thus, a protective film 64 is formed. The protective film 64 is provided to protect the surface 2a of the light emitting element 2 in forming a reflecting section 65.

Figure 12B:
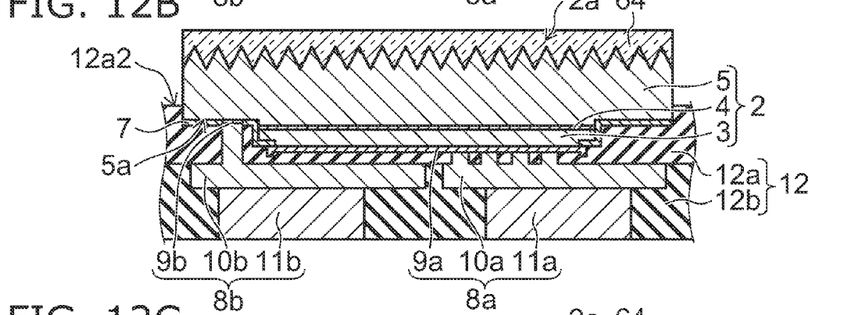

Next, as shown in FIG. 12B, the protective film 64 located on the side surface side of the second semiconductor layer 5 is removed. Furthermore, the upper surface 12a2 of the first sealing section 12a located on the side surface side of the second semiconductor layer 5 is set back. Here, the position of the upper surface 12a2 can be set above the lower surface 5a of the second semiconductor layer 5.

The removal of the protective film 64 and the setting back of the upper surface 12a2 of the first sealing section 12a can be performed by using e.g. the photolithography technique and dry etching technique.

Figure 12C:
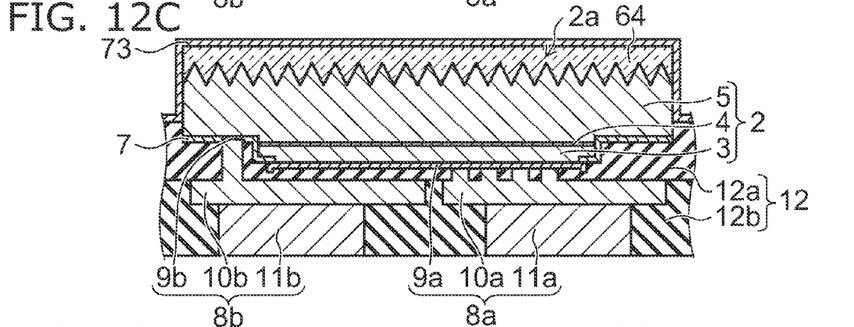

Next, as shown in FIG. 12C, a film 73 constituting a reflecting section 65 is formed so as to cover the entire surface on the surface 2a side of the light emitting element 2. The film 73 constituting a reflecting section 65 can be formed by forming a film made of aluminum using a technique such as sputtering.

Figure 12D:
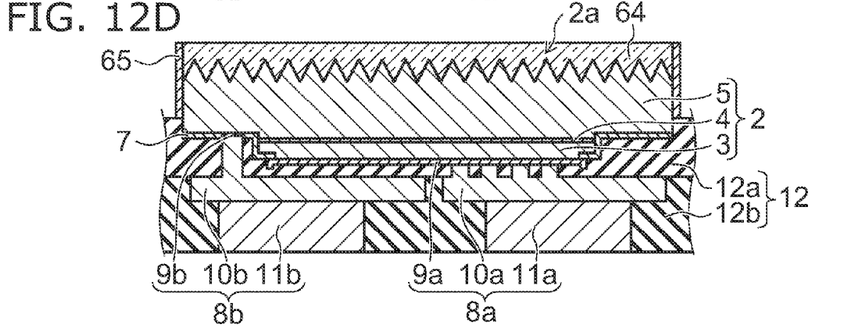

Next, as shown in FIG. 12D, the film 73 other than the portion located on the side surface side of the second semiconductor layer 5 is removed to form a reflecting section 65. The reflecting section 65 can be formed by using e.g. the photolithography technique and an anisotropic etching technique such as the RIE (reactive ion etching) technique. In the case where the film 73 is formed from aluminum, the RIE technique using a chlorine-containing gas can be used.

In this case, by changing the thickness of the protective film 64, the height dimension of the reflecting section 65 can be changed. Thus, the light distribution characteristic can be changed.

After forming the reflecting section 65, the formation of the light distribution control section 13, 53a, 53b and the formation of the translucent section 6, 26 described above can be performed.

As described above, a plurality of light emitting devices can be collectively manufactured.

Next, as necessary, the light emitting devices are singulated.

Figure 13A:
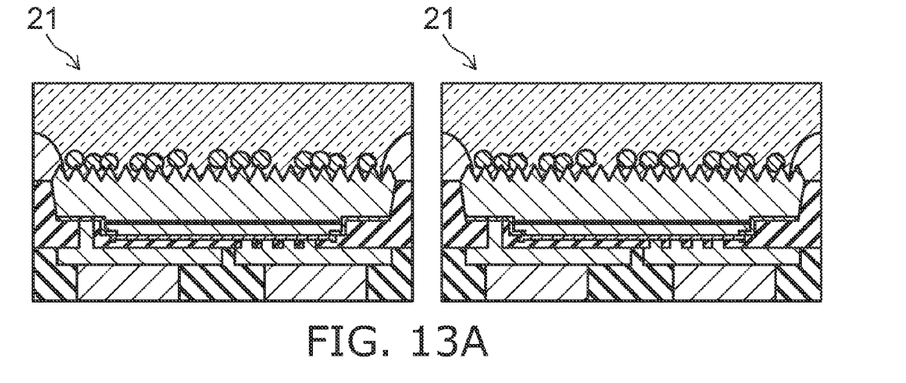
FIGS. 13A to 13C are schematic process sectional views illustrating the singulation of the light emitting device.
Figure 13B:
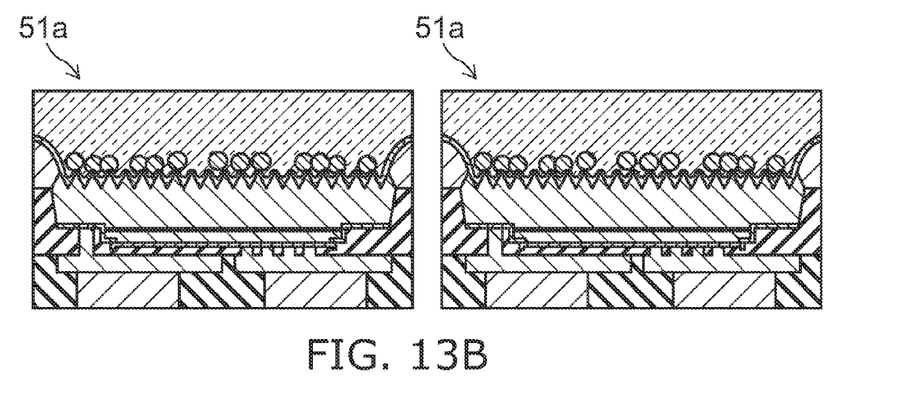
Figure 13C:
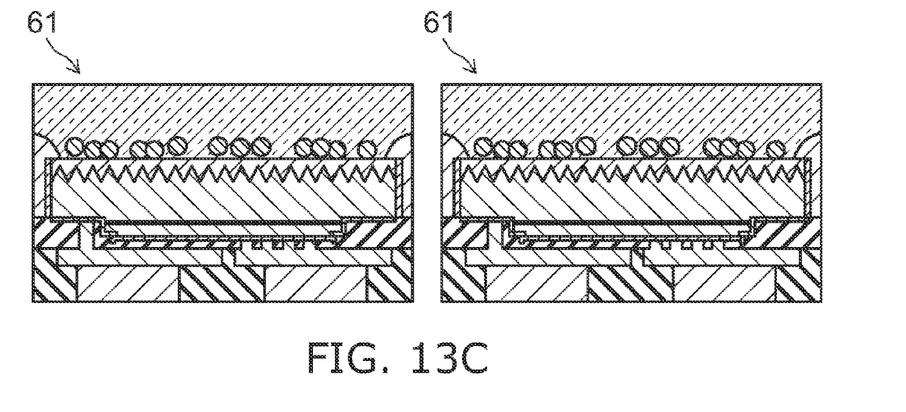

FIGS. 13A to 13C are schematic process sectional views illustrating the singulation of the light emitting device.

By way of example, FIG. 13A illustrates the singulation of the light emitting device 21. FIG. 13B illustrates the singulation of the light emitting device 51a. FIG. 13C illustrates the singulation of the light emitting device 61.

As shown in FIGS. 13A to 13C, by cutting between the light emitting devices, the light emitting devices are singulated.

Examples of the cutting method can include mechanical cutting using e.g. a diamond blade, cutting based on laser irradiation, and cutting with high-pressure water.

The manufacturing method as described above can efficiently manufacture a light emitting device capable of changing the light distribution characteristic.

Furthermore, a light emitting device as small as the size of the light emitting element 2 can be easily manufactured.

Furthermore, there is no need to use mounting members such as a lead frame and ceramic substrate. Thus, wiring, sealing and the like can be performed on the wafer level. Furthermore, inspection can be performed on the wafer level. Thus, the productivity of the manufacturing process can be improved. As a result, cost reduction is facilitated.

The embodiments illustrated above can realize a light emitting device capable of changing the light distribution characteristic and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A light emitting device comprising:
    a light emitting element including (i) a first surface that emits light and (ii) lateral surfaces extending from the first surface;
    a translucent section provided in contact with the first surface; and
    a light distribution control section provided on an edge portion of the first surface and having a lower refractive index than a refractive index of the translucent section, the light distribution control section being in contact with the first surface and partially overlapping with the first surface, and the light distribution control section not being in contact with the lateral surfaces;

wherein the light distribution control section is translucent and includes an inclined surface, and the inclined surface is in contact with the first surface, partially overlaps a portion of the first surface, and is inclined such that a tip of the inclined surface of the light distribution control section does not overlap with the first surface.

2. The light-emitting device according to claim 1, wherein the light distribution control section is provided so as to surround the first surface.

3. The light-emitting device according to claim 1, wherein the inclined surface includes a curved surface.

4. The light-emitting device according to claim 1, wherein the translucent section is provided so as to cover the inclined surface.

5. The light-emitting device according to claim 1, wherein the translucent section includes a translucent material and a phosphor.

6. The light-emitting device according to claim 5, wherein the phosphor is unevenly distributed on the first surface side inside the translucent section.

7. The light-emitting device according to claim 5, wherein the phosphor is in contact with the first surface.

8. The light-emitting device according to claim 5, wherein the phosphor is located only inside a periphery of the first surface.

9. The light-emitting device according to claim 5, wherein the phosphor is particulate, and a height dimension of the light distribution control section is larger than an average diameter dimension of the phosphor.

10. The light-emitting device according to claim 1, wherein a height dimension of the light distribution control section is less than or equal to a thickness dimension of the translucent section.

11. The light-emitting device according to claim 1, wherein the light distribution control section includes a gas in an atmosphere in which the light emitting device is provided.

12. The light-emitting device according to claim 4, further comprising:
   a translucent film between the inclined surface and the translucent section.

13. The light-emitting device according to claim 12, wherein a refractive index of the translucent film is lower than the refractive index of the translucent section.

14. The light-emitting device according to claim 1, further comprising:
   a reflecting section provided on the lateral surfaces of the light emitting element.

15. The light-emitting device according to claim 1, wherein the first surface is uneven.

16. The light-emitting device according to claim 1, wherein a dimension of a cross section of the light distribution control section, in a direction orthogonal to a height direction of the light distribution control section, gradually decreases towards the tip of the inclined surface of the light distribution control section.

* * * * *